(12) United States Patent
Lee et al.

(10) Patent No.: US 10,673,420 B2
(45) Date of Patent: Jun. 2, 2020

(54) ELECTRONIC CIRCUIT INCLUDING FLIP-FLOP USING COMMON CLOCK

(71) Applicant: SAMSUNG ELECTRONICS CO., LTD., Suwon-si, Gyeonggi-Do (KR)

(72) Inventors: Hyun Lee, Gyeyang-gu Incheon (KR); Dae Seong Lee, Busan (KR); Minsu Kim, Hwaseong-si (KR); Ahreum Kim, Daegu (KR); Chunghee Kim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 50 days.

(21) Appl. No.: 15/981,415

(22) Filed: May 16, 2018

(65) Prior Publication Data
US 2019/0109586 A1   Apr. 11, 2019

(30) Foreign Application Priority Data

Oct. 11, 2017 (KR) .................... 10-2017-0131495

(51) Int. Cl.
*H03K 3/037* (2006.01)
*H03K 19/20* (2006.01)
*G06F 1/10* (2006.01)
*G01R 31/317* (2006.01)
*G01R 31/3177* (2006.01)

(52) U.S. Cl.
CPC ....... *H03K 3/0372* (2013.01); *G01R 31/3177* (2013.01); *G01R 31/31727* (2013.01); *G06F 1/10* (2013.01); *H03K 19/20* (2013.01)

(58) Field of Classification Search
CPC ...... H03K 3/037; H03K 3/0372; H03K 19/20; H03K 19/21; H03K 19/212; H03K 19/215; H03K 19/217; G01R 31/31727; G01R 31/3177; G06F 1/10; G06F 1/105
See application file for complete search history.

(56) References Cited

U.S. PATENT DOCUMENTS

| | | | |
|---|---|---|---|
| 8,484,523 B2 | 7/2013 | Maraju et al. | |
| 9,310,435 B2 | 4/2016 | Chen et al. | |
| 9,490,783 B1 | 11/2016 | Hill | |
| 9,513,658 B2 | 12/2016 | Rishnamurthy et al. | |
| 9,915,933 B2 * | 3/2018 | Kim .................... | G05B 19/045 |
| 2004/0119496 A1 | 6/2004 | Park et al. | |
| 2016/0013783 A1 * | 1/2016 | Jeong .................. | H03K 17/005 327/145 |
| 2016/0301391 A1 | 10/2016 | Srivastava et al. | |
| 2017/0077910 A1 | 3/2017 | Kim et al. | |

FOREIGN PATENT DOCUMENTS

| | | |
|---|---|---|
| KR | 10-2016-0040085 A | 4/2016 |
| KR | 10-2017-0030947 A | 3/2017 |

* cited by examiner

*Primary Examiner* — Lincoln D Donovan
*Assistant Examiner* — Diana J. Cheng
(74) *Attorney, Agent, or Firm* — Volentine, Whitt & Francos, PLLC

(57) ABSTRACT

An electronic circuit includes a first flip-flop, a second flip-flop, and a clock generator. The first flip-flop comprises a first master latch and a first slave latch arranged in order along a first direction. The second flip-flop comprises a second master latch and a second slave latch arranged in order along a second direction that is opposite to the first direction. The clock generator is arranged between the first master latch and the second master latch and outputs a clock.

17 Claims, 10 Drawing Sheets

ELECTRONIC CIRCUIT INCLUDING FLIP-FLOP USING COMMON CLOCK

CROSS-REFERENCE TO RELATED APPLICATIONS

This application claims priority under 35 U.S.C. § 119 to Korean Patent Application No. 10-2017-0131495 filed Oct. 11, 2017, in the Korean Intellectual Property Office, the disclosure of which is incorporated by reference herein in its entirety.

BACKGROUND

Embodiments of the disclosure herein relate to an electronic circuit, and more particularly, relate to a flip-flop.

Nowadays, the size of a mobile device is being reduced as mobile technologies develop. To reduce the size of the mobile device, technologies for designing the mobile device are being developed. In particular, reduction in the area of a chip used in the mobile device gradually becomes significant.

A flip-flop that is one of components constituting the mobile device may store 1-bit data. For example, flip-flops are divided into common types: SR (set-reset), D (delay or data), JK, and T (toggle). A designer may use flip-flops for the purpose of processing digital data based on a clock.

Flip-flops may be arranged in a chip to constitute an application processor (AP) and the like. Even though flip-flops include the same elements, the area of a chip occupied by a flip-flop varies depending on the arrangement of the flip-flop. Accordingly, the arrangement of the flip-flop is significant to reduce the area of a chip.

SUMMARY

Embodiments of the disclosure provide an electronic circuit including a flip-flop arranged in a small area.

According to an exemplary embodiment, an electronic circuit may include a first flip-flop, a second flip-flop, and a clock generator. The first flip-flop may include a first master latch and a first slave latch arranged in order along a first direction. The second flip-flop may include a second master latch and a second slave latch arranged in order along a second direction that is opposite to the first direction. The clock generator may be arranged between the first master latch and the second master latch and may output a clock.

According to another exemplary embodiment, an electronic circuit may include a first flip-flop configured to receive a first signal and to transmit a signal corresponding to the first signal to a first output circuit along a first direction in response to a clock. A second flip-flop is configured to receive a second signal and to transmit a signal corresponding to the second signal to a second output circuit along a second direction that is opposite to the first direction in response to the clock. A clock generator is arranged between the first flip-flop and the second flip-flop and configured to generate the clock. The first direction is a direction that faces the first output circuit from the clock generator, and the second direction is a direction that faces the second output circuit from the clock generator.

According to another exemplary embodiment, an electronic circuit may include an electronic circuit having a first row with a first multiplexer and a first flip-flop arranged in order along a first direction and a second multiplexer and a second flip-flop arranged in order along a second direction. A second row includes a third multiplexer and a third flip-flop arranged in order along the first direction and a fourth multiplexer and a fourth flip-flop arranged in order along the second direction. A clock generator is configured to output a clock to the first to fourth flip-flops. A select signal generator is configured to output a select signal to the first to fourth multiplexers. The clock generator is included in the first row and is arranged between the first multiplexer and the second multiplexer, and the select signal generator is included in the second row and is arranged between the third multiplexer and the fourth multiplexer.

BRIEF DESCRIPTION OF THE FIGURES

The above and other objects and features of the disclosure will become apparent by describing in detail exemplary embodiments thereof with reference to the accompanying drawings.

DETAILED DESCRIPTION

Below, embodiments of the disclosure may be described in detail and clearly to such an extent that an ordinary one in the art easily implements the disclosure.

Figure 1:
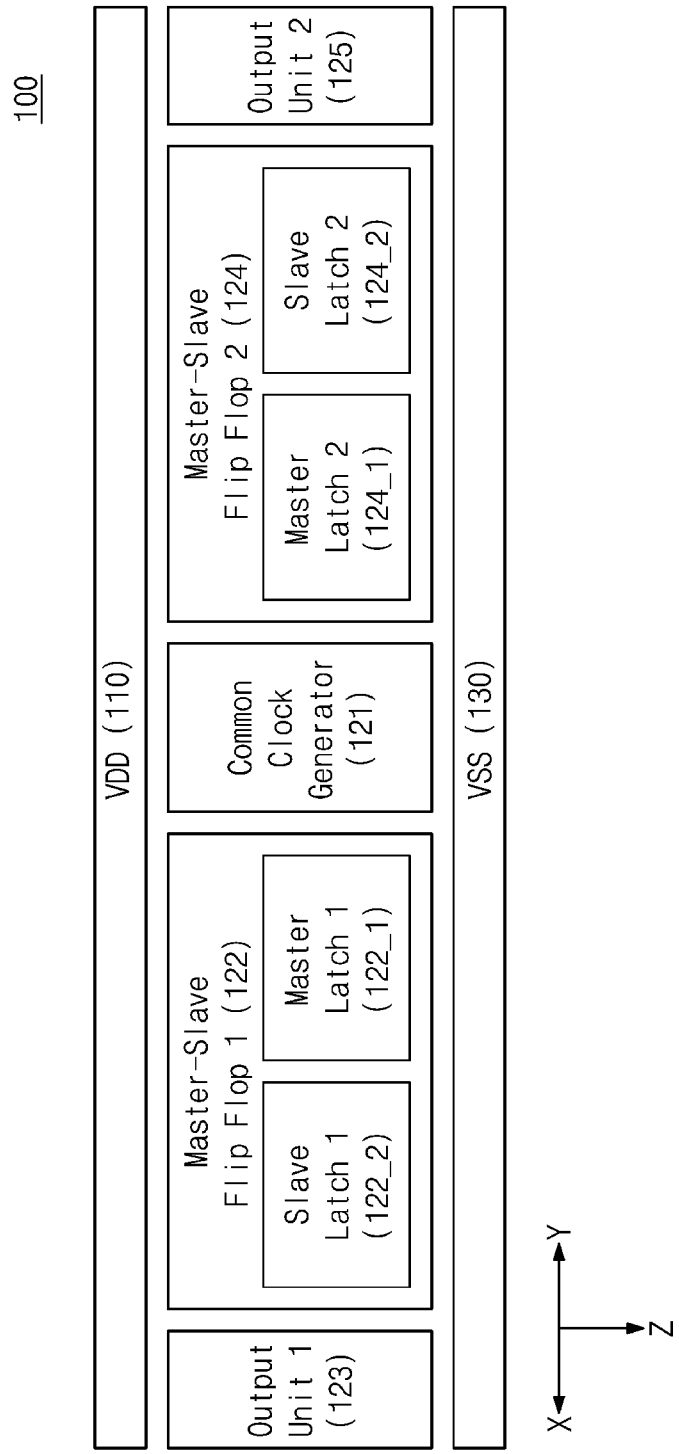
FIG. 1 is a block diagram illustrating arrangement of a flip-flop according to an embodiment of the disclosure.

FIG. 1 is a block diagram illustrating arrangement of a flip-flop according to an embodiment of the disclosure.

Referring to FIG. 1, a flip-flop 100 may include a common clock generator 121, a first master-slave flip-flop 122, a second master-slave flip-flop 124, a first output unit 123, a second output unit 125, a first bias rail 110, and a second bias rail 130. However, the flip-flop 100 is an embodiment of the disclosure, and the disclosure may include all exemplary flip-flops including one or more master-slave flip-flops.

The first master-slave flip-flop 122 may include a first master latch 122_1 and a first slave latch 122_2. The second master-slave flip-flop 124 may include a second master latch 124_1 and a second slave latch 124_2.

A first direction "X" and a third direction "Z" intersect each other. A second direction "Y" and the third direction "Z" intersect each other. For example, an angle between the first direction "X" and the third direction "Z" may be a right angle. An angle between the second direction "Y" and the third direction "Z" may be a right angle. The first direction "X" and the second direction "Y" may be different from each other. For example, the first direction "X" and the second direction "Y" may be opposite to each other.

In the example of FIG. 1, the first master-slave flip-flop 122, the common clock generator 121, and the second master-slave flip-flop 124 may be arranged in order along the second direction "Y". However, the arrangement illustrated in FIG. 1 may be only an embodiment of the disclosure, and the disclosure may include all exemplary arrangements of the first master-slave flip-flop 122 and the common clock generator 121, which are adjacent to each other, and the common clock generator 121 and the second master-slave flip-flop 124, which are adjacent to each other.

Components of the first master-slave flip-flop 122 and the second master-slave flip-flop 124 may be arranged in consideration of a flow of signal. For example, the first master latch 122_1, the first slave latch 122_2, and the first output unit 123 may be arranged in order along the first direction "X". In addition, the second master latch 124_1, the second slave latch 124_2, and the second output unit 125 may be arranged in order along the second direction "Y". A detailed signal flow in the flip-flop 100 will be described with reference to FIG. 2.

That is, the detailed arrangement of components of the flip-flop 100 is as follows. The first master latch 122_1 may be disposed between the common clock generator 121 and the first output unit 123, and the first slave latch 122_2 may be disposed between the first master latch 122_1 and the first output unit 123. The second master latch 124_1 may be disposed between the common clock generator 121 and the second output unit 125, and the second slave latch 124_2 may be disposed between the second master latch 124_1 and the second output unit 125. The first output unit 123, the first slave latch 122_2, the first master latch 122_1, the common clock generator 121, the second master latch 124_1, the second slave latch 124_2, and the second output unit 125 may be arranged in order along one direction (e.g., the second direction "Y").

The first bias rail 110, the first and second master-slave flip-flops 122 and 124, and the second bias rail 130 may be arranged along the third direction "Z". In addition, the first bias rail 110, the common clock generator 121, and the second bias rail 130 may be arranged along the third direction "Z". That is, the common clock generator 121, the first master latch 122_1, the first slave latch 122_2, the first output unit 123, the second master latch 124_1, the second slave latch 124_2, and the second output unit 125 may be disposed between the first bias rail 110 and the second bias rail 130.

The first bias rail 110 may supply a bias voltage VDD. The second bias rail 130 may supply a bias voltage VSS. For example, the bias voltage VDD or the bias voltage VSS may be supplied from a device such as a voltage generator or the like. For example, the bias voltage VDD and the bias voltage VSS may be fixed in level. Alternatively, the bias voltage VDD and the bias voltage VSS may be variable in level.

The components of the flip-flop 100 may be connected to each other by metal routing. For example, the components of the flip-flop 100 may be connected to each other by lines including a metal line. The common clock generator 121 may be connected with the first master latch 122_1 and the first slave latch 122_2. The first master latch 122_1 may be connected with the first slave latch 122_2. The first slave latch 122_2 may be connected with the first output unit 123.

The common clock generator 121 may be connected with the second master latch 124_1 and the second slave latch 124_2. The second master latch 124_1 may be connected with the second slave latch 124_2. The second slave latch 124_2 may be connected with the second output unit 125.

Each of the first bias rail 110 and the second bias rail 130 may be connected with the common clock generator 121, the first master latch 122_1, the first slave latch 122_2, the first output unit 123, the second master latch 124_1, the second slave latch 124_2, and the second output unit 125. The common clock generator 121, the first master latch 122_1, the first slave latch 122_2, the first output unit 123, the second master latch 124_1, the second slave latch 124_2, and the second output unit 125 may be supplied with the bias voltage VDD and the bias voltage VSS through the first bias rail 110 and the second bias rail 130.

The common clock generator 121 may output clocks. The clocks output by the common clock generator 121 may include a clock and an inverted clock (refer to FIG. 2). The first master latch 122_1, the first slave latch 122_2, the second master latch 124_1, and the second slave latch 124_2 may operate in response to the clocks from the common clock generator 121.

In the example of FIG. 1, the flip-flop 100 may include only one common clock generator 121. In the flip-flop 100, the routing metal for connecting the common clock generator 121 and other components may be smaller than a flip-flop including two or more common clock generators.

In the example of FIG. 1, the common clock generator 121 may be disposed between the first master-slave flip-flop 122 and the second master-slave flip-flop 124. In the case where the common clock generator 121 is disposed between the first master-slave flip-flop 122 and the second master-slave flip-flop 124, a sum of a distance from the common clock generator 121 to the first master-slave flip-flop 122 and a distance from the common clock generator 121 to the second master-slave flip-flop 124 may be minimized. As the sum of the above-described distances decreases, the routing metal for connecting the common clock generator 121 and the master-slave flip-flops 122 and 124 may decrease. Accordingly, the flip-flop 100 may include less routing metal than a flip-flop including the common clock generator 121 that is not disposed between the master-slave flip-flops 122 and 124.

As the routing metal decreases, power consumption for a signal transfer between components may decrease. Accordingly, power consumption of the flip-flop 100 of FIG. 1 may decrease. In addition, that the area for the routing metal decreases as the routing metal decreases may mean that the arrangement area of the flip-flop 100 decreases. Accordingly, it may be possible to efficiently design a small electronic chip by using the flip-flop 100.

Figure 2:
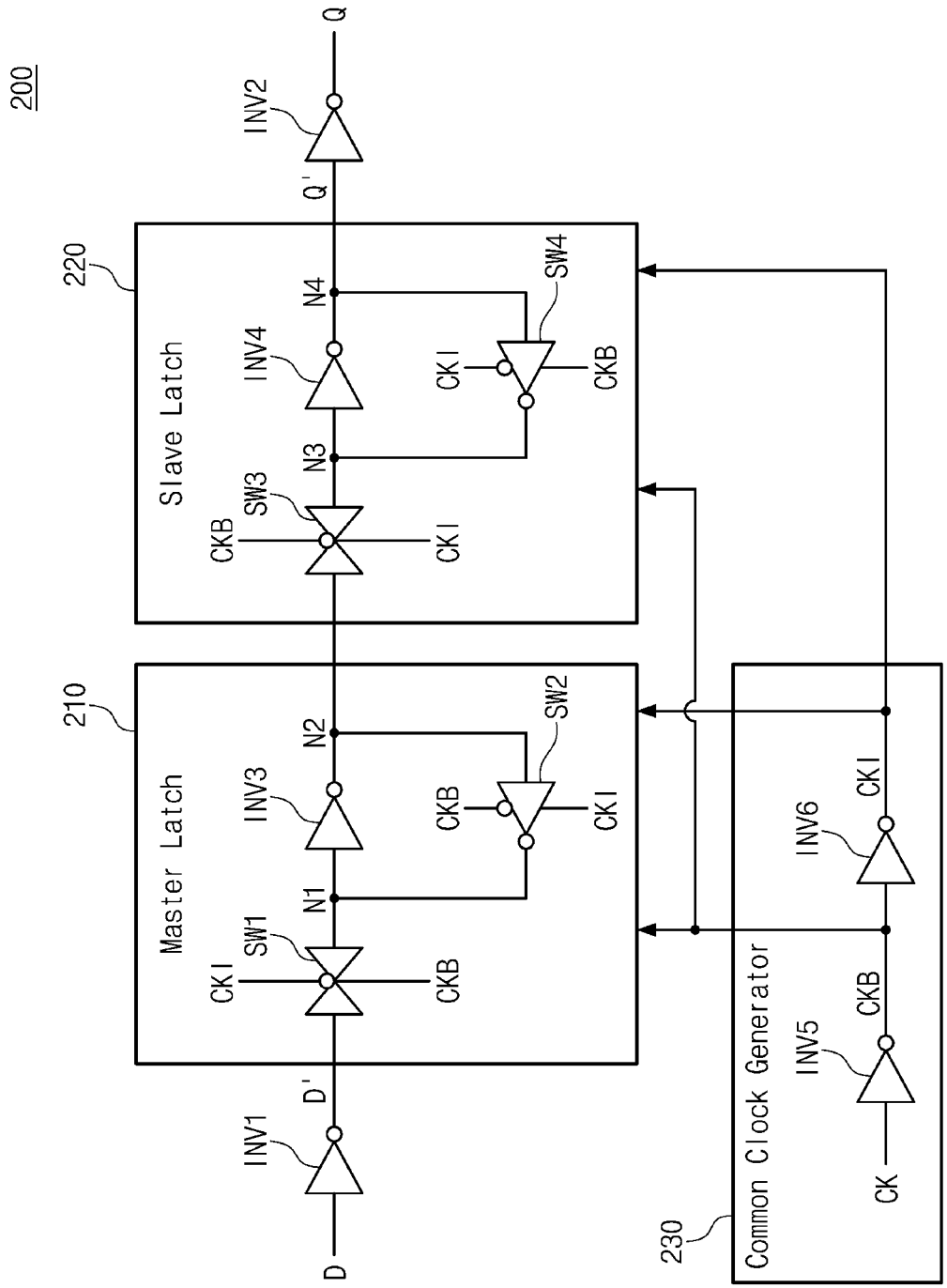
FIG. 2 is a circuit diagram illustrating an exemplary configuration of first and second master-slave flip-flops of FIG. 1.

FIG. 2 is a circuit diagram illustrating an exemplary configuration of first and second master-slave flip-flops of FIG. 1. Each of the first master-slave flip-flop 122 and the second master-slave flip-flop 124 may include a master-slave flip-flop 200 of FIG. 2.

Referring to FIG. 2, the master-slave flip-flop 200 may include a first inverter INV1, a second inverter INV2, a master latch 210, a slave latch 220, and a common clock generator 230. Each of the first and second master latches 122_1 and 124_1 of FIG. 1 may include the master latch 210 of FIG. 2. Each of the first and second slave latches 122_2 and 124_2 of FIG. 1 may include the slave latch 220 of FIG. 2. The common clock generator 121 of FIG. 1 may include the common clock generator 230 of FIG. 2. Each of the first and second output units 123 and 125 of FIG. 1 may include the second inverter INV2 of FIG. 2.

The first inverter INV1 may receive an input signal "D". The first inverter INV1 may invert the input signal "D". The first inverter INV1 may output a signal D'. The second inverter INV2 may receive a signal Q'. The second inverter INV2 may invert the signal Q'. The second inverter INV2 may output a signal "Q" as an output signal. The first inverter INV1 and the second inverter INV2 may perform a buffer role.

FIG. 2 illustrates the master-slave flip-flop 200 including the first and second inverters INV1 and INV2, but the disclosure may include one or more inverters as a buffer. For example, an additional buffer inverter may be connected with the second inverter INV2. The buffer inverter may receive the signal "Q" from the second inverter INV2. The buffer inverter may invert the signal "Q". The buffer inverter may output the signal Q' as an output signal. The signal Q' may have a complementary logical value to a logical value of the signal "Q". For convenience of description, below, there will be described the master-slave flip-flop 200 that includes the first and second inverters INV1 and INV2 and outputs the signal "Q" as an output signal.

Each of the input signal "D", the signal D', the signal Q', and the signal "Q" may have a logical value. Logical values of the input signal "D" and the signal D' may be complementary. Logical values of the input signal Q' and the output signal "Q" may be complementary. Logical values of signals may be associated with specific data. For example, in the case where the flip-flop 100 is included in a processor, logical values may be associated with data that are processed or will be processed by the processor.

The master latch 210 may include a first switch SW1, a second switch SW2, and a third inverter INV3. The first switch SW1 may receive the signal D'. The first switch SW1 may output a signal corresponding to the signal D' to a first node N1 in response to an inverted clock CKB and a clock CKI. For example, the first switch SW1 may output a signal having the same logical value as the signal D' to the first node N1 in response to the inverted clock CKB and the clock CKI. For example, the first switch SW1 may include at least one transmission gate.

The second switch SW2 may receive a signal from a second node N2. The second switch SW2 may invert the signal received from the second node N2. The second switch SW2 may output a signal corresponding to the signal received from the second node N2 to the first node N1 in response to the inverted clock CKB and the clock CKI. For example, the second switch SW2 may output a signal having a complementary logical value to a logical value of the signal received from the second node N2 to the first node N1 in response to the inverted clock CKB and the clock CKI. For example, the second switch SW2 may include at least one inverter.

The third inverter INV3 may receive a signal from the first node N1. The third inverter INV3 may invert the signal received from the first node N1. The third inverter INV3 may output a signal having a complementary logical value to a logical value of the signal received from the first node N1 to the second node N2.

The slave latch 220 may include a third switch SW3, a fourth switch SW4, and a fourth inverter INV4. The slave latch 220 may receive a signal from the master latch 210. The third switch SW3 may receive a signal from the second node N2. The third switch SW3 may output a signal corresponding to the signal received from the second node N2 to a third node N3 in response to the inverted clock CKB and the clock CKI. Here, the third switch SW3 may output a signal having the same logical value as a logical value of the signal received from the second node N2 to the third node N3 in response to the inverted clock CKB and the clock CKI. For example, the third switch SW3 may include at least one transmission gate.

The fourth switch SW4 may receive a signal from a fourth node N4. The fourth switch SW4 may invert the signal received from the fourth node N4. The fourth switch SW4 may output a signal corresponding to the signal received from the fourth node N4 to the third node N3 in response to the inverted clock CKB and the clock CKI. The fourth switch SW4 may output a signal having a complementary logical value to a logical value of the signal received from the fourth node N4 to the third node N3 in response to the inverted clock CKB and the clock CKI. For example, the fourth switch SW4 may include at least one inverter.

The fourth inverter INV4 may receive a signal from the third node N3. The fourth inverter INV4 may invert the signal received from the third node N3. The fourth inverter INV4 may output a signal having a complementary logical value to a logical value of the signal received from the third node N3 to the fourth node N4.

The common clock generator 230 may include a fifth inverter INV5 and a sixth inverter INV6. The common clock generator 230 may receive a clock CK. For example, the common clock generator 230 may receive the clock CK with a constant period from an external clock generator or the like. The fifth inverter INV5 may receive the clock CK. The fifth inverter INV5 may invert the received clock CK. The fifth inverter INV5 may output the inverted clock CKB. The sixth inverter INV6 may receive the inverted clock CKB. The sixth inverter INV6 may invert the received inverted clock CKB. The sixth inverter INV6 may output the clock CKI.

FIG. 2 illustrates the common clock generator 230 including two inverters INV5 and INV6, but the disclosure may include the common clock generator 230 including one or more inverters. For example, the disclosure may include the common clock generator 230 including only the fifth inverter INV5. The common clock generator 230 including only the fifth inverter INV5 may output the clock CK as the clock CKI. The fifth inverter INV5 may invert the clock CK. The fifth inverter INV5 may output the inverted clock CKB. For convenience of description, below, there will be described the common clock generator 230 that includes the fifth and sixth inverters INV5 and INV6.

Each of the inverted clock CKB and the clock CKI may periodically have two logical values. For example, each of the inverted clock CKB and the clock CKI may periodically have a logical high value and a logical low value. The inverted clock CKB and the clock CKI may have a logical high value during a specific time of one period and may have a logical low value during the remaining time other than the specific time. For example, the inverted clock CKB and the clock CKI may have a logical high value during half the period and may have a logical low value during the remaining half of the period.

Logical values of the inverted clock CKB and the clock CKI may be complementary. For example, in the case where the inverted clock CKB has a logical high value, the clock CKI may have a logical low value by the sixth inverter INV6. In the case where the inverted clock CKB has a logical low value, the clock CKI may have a logical high value by the sixth inverter INV6. The period of the inverted clock CKB and the clock CKI may be substantially the same as the period of the clock CK.

The master latch 210 may store a uniform logical value during half the period of the inverted clock CKB and the clock CKI in response to the inverted clock CKB and the clock CKI. For example, the signal D' may have a logical high value. The first switch SW1 may output a signal having a logical high value to the first node N1 in response to the logical high value of the inverted clock CKB and the logical low value of the clock CKI.

The third inverter INV3 may receive a signal having the logical high value from the first node N1. The third inverter INV3 may output a signal having the logical low value to the second node N2. While the inverted clock CKB has the logical high value and the clock CKI has the logical low value, the second switch SW2 and the third switch SW3 may be in a turn-off state. Accordingly, while the inverted clock CKB has the logical high value and the clock CKI has the logical low value, the first node N1 may store the logical high value, and the second node N2 may store the logical low value.

As in the case where the signal D' has the logical high value, in the case where the D' has the logical low value, the master latch 210 may store a uniform logical value, and thus, a description thereof will not be repeated here.

For example, the slave latch 220 may output the signal Q' having a uniform logical value during half the period of the inverted clock CKB and the clock CKI in response to the inverted clock CKB and the clock CKI. For example, a signal received from the master latch 210 may have the logical high value. The third switch SW3 may receive a signal having the logical high value from the second node N2. The third switch SW3 may output a signal having the logical high value to the third node N3 in response to the logical low value of the inverted clock CKB and the logical high value of the clock CKI.

The fourth inverter INV4 may receive a signal having the logical high value from the third node N3. The fourth inverter INV4 may output a signal having the logical low value to the fourth node N4. While the inverted clock CKB has the logical low value and the clock CKI has the logical high value, the fourth switch SW4 may be in a turn-off state. Accordingly, while the inverted clock CKB has the logical low value and the clock CKI has the logical high value, the slave latch 200 may output the signal Q' having the logical low value. The flip-flop 200 may output the signal "Q" having the logical high value by the second inverter INV2.

As in the case where a signal received from the master latch 210 has the logical high value, in the case where a signal received from the master latch 210 has the logical low value, the slave latch 220 may output a signal having a uniform logical value, and thus, a description thereof will not be repeated here.

Referring to FIGS. 1 and 2, a signal transmitted within the first master-slave flip-flop 122 of FIG. 1 may flow along the first direction "X". The first direction "X" may be a direction that faces the first output unit 123 from the common clock generator 121. In addition, a signal transmitted within the second master-slave flip-flop 124 of FIG. 1 may flow along the second direction "X". The second direction "Y" may be a direction that faces the second output unit 125 from the common clock generator 121. For example, the input signal "D" may be input to the first master-slave flip-flop 122, and signals corresponding to the input signal "D" may be transmitted to the first output unit 123 along the first direction "X". For example, the input signal "D" may be input to the second master-slave flip-flop 124, and signals corresponding to the input signal "D" may be transmitted to the second output unit 125 along the second direction "Y". That is, the first master-slave flip-flop 122, the first output unit 123, the second master-slave flip-flop 124, the second output unit 125, and the common clock generator 121 may be arranged in consideration of a flow of signal.

Figure 3:
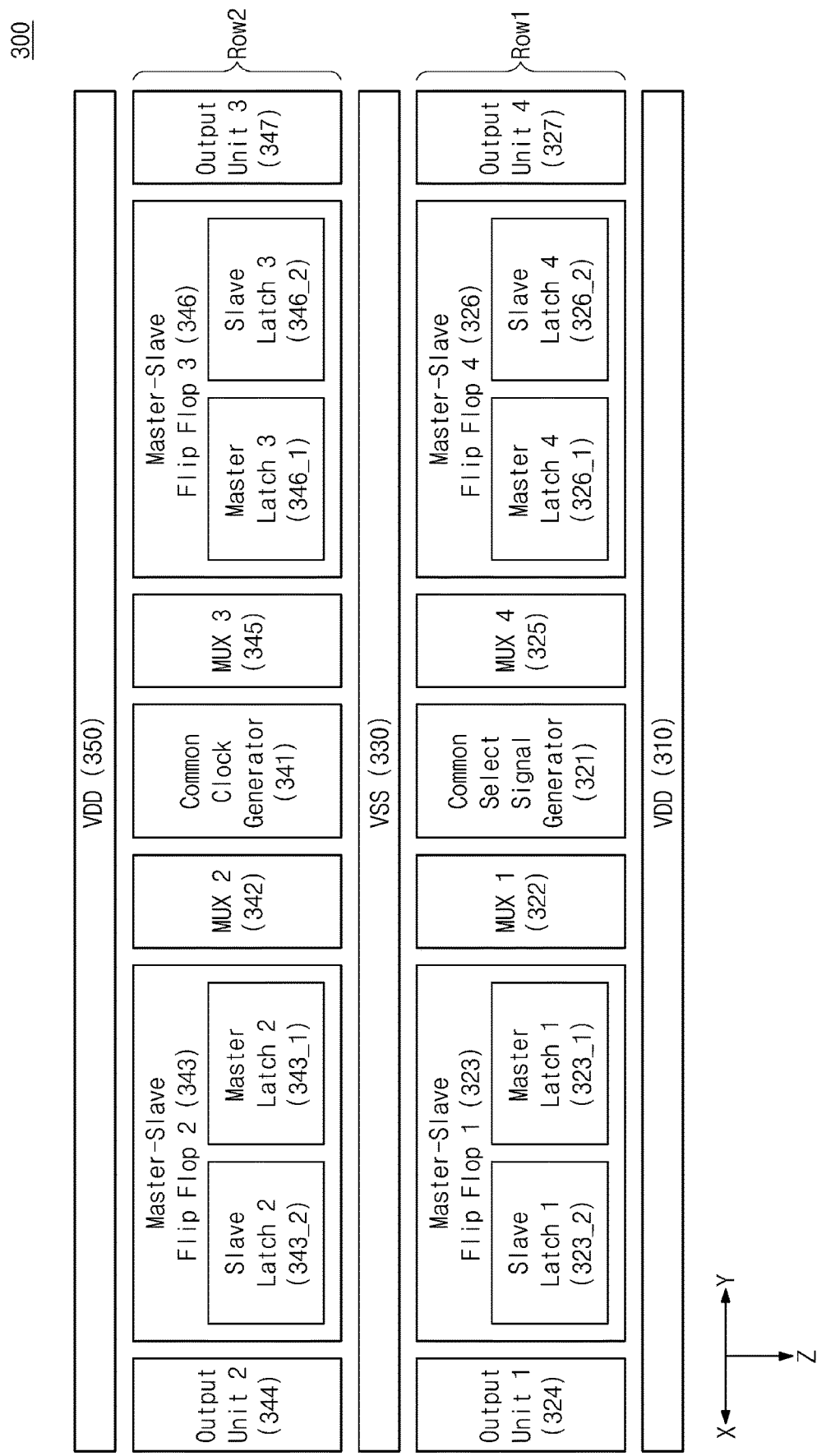
FIG. 3 is a block diagram illustrating arrangement of the flip-flop according to an embodiment of the disclosure.

FIG. 3 is a block diagram illustrating arrangement of a flip-flop according to an embodiment of the disclosure. Referring to FIG. 3, a flip-flop 300 may include a first row, a second row, a first bias rail 310, a second bias rail 330, and a third bias rail 350.

The first row may include a first multiplexer 322, a first master-slave flip-flop 323, a first output unit 324, a fourth multiplexer 325, a fourth master-slave flip-flop 326, a fourth output unit 327, and a common select signal generator 321. The second row may include a second multiplexer 342, a second master-slave flip-flop 343, a second output unit 344, a third multiplexer 345, a third master-slave flip-flop 346, a third output unit 347, and a common clock generator 341.

However, the flip-flop 300 of FIG. 3 is an embodiment of the disclosure, and the disclosure may include all exemplary flip-flops including one or more master-slave flip-flops and one or more multiplexers.

The first master-slave flip-flop 323 may include a first master latch 323_1 and a first slave latch 323_2. The second master-slave flip-flop 343 may include a second master latch 343_1 and a second slave latch 343_2. The third master-slave flip-flop 346 may include a third master latch 346_1 and a third slave latch 346_2. The fourth master-slave flip-flop 326 may include a fourth master latch 326_1 and a fourth slave latch 326_2.

The relationship between the first direction "X", the second direction "Y", and the third direction "Z" may be similar to the description given with reference to FIG. 1, and thus, a description thereof will not be repeated here.

The term "symmetry" is used in this specification. The symmetry may mean that two components are disposed in spaces substantially corresponding to each other with respect to any component.

In the example of FIG. 3, the first master-slave flip-flop 323 may be disposed at a location that is symmetrical to the second master-slave flip-flop 343 with respect to the second bias rail 330. The third master-slave flip-flop 346 may be disposed at a location that is symmetrical to the second master-slave flip-flop 343 with respect to the common clock generator 341. The fourth master-slave flip-flop 326 may be disposed at a location that is symmetrical to the third master-slave flip-flop 346 with respect to the second bias rail 330. The fourth master-slave flip-flop 326 may be disposed at a location that is symmetrical to the first master-slave flip-flop 323 with respect to the common select signal generator 321.

FIG. 3 may include an embodiment in which the first, second, third, and fourth master-slave flip-flops 323, 343, 346, and 326 are arranged as discussed above and illustrated in FIG. 3, but the disclosure may include all embodiments in which more master-slave flip-flops are arranged similarly to the arrangement of the first, second, third, and fourth master-slave flip-flops 323, 343, 346, and 326 of FIG. 3.

The third bias rail 350, the second row, the second bias rail 330, the first row, and the first bias rail 310 may be arranged in order along the third direction "Z". That is, the common clock generator 341 may be disposed at a location that is symmetrical to the common select signal generator 321 with respect to the second bias rail 330.

The first bias rail 310 and the third bias rail 350 may supply the bias voltage VDD. The second bias rail 330 may supply the bias voltage VSS. The bias voltage VDD or the bias voltage VSS may be supplied from a device such as a voltage generator or the like. For example, the bias voltage VDD and the bias voltage VSS may be fixed in level. Alternatively, the bias voltage VDD and the bias voltage VSS may be variable in level.

The common select signal generator 321, the first multiplexer 322, the first master-slave flip-flop 323, and the first output unit 324 may be arranged in order along the first direction "X". The common select signal generator 321, the fourth multiplexer 325, the fourth master-slave flip-flop 326, and the fourth output unit 327 may be arranged in order along the second direction "Y". The common clock generator 341, the second multiplexer 342, the second master-slave flip-flop 343, and the second output unit 344 may be arranged in order along the first direction "X". The common clock generator 341, the third multiplexer 345, the third master-slave flip-flop 346, and the third output unit 347 may be arranged in order along the second direction "Y".

Compared with the flip-flop 100 of FIG. 1, the common select signal generator 321 may be disposed in the first row instead of the common clock generator 341. In addition, the first multiplexer 322 may be disposed between the first master latch 323_1 and the common select signal generator 321. Compared with the flip-flop 100 of FIG. 1, the second multiplexer 342 may be disposed between the second master latch 343_1 and the common clock generator 341.

The arrangement of the common select signal generator 321 and the common clock generator 341 included in the flip-flop 300 may be an embodiment of the disclosure. The common clock generator 341 may be included in the first row and may be disposed between the first multiplexer 322 and the fourth multiplexer 325, and the common select signal generator 321 may be included in the second row and may be disposed between the second multiplexer 342 and the third multiplexer 345.

The arrangement of components of the first, second, third, and fourth master-slave flip-flops 323, 343, 346, and 326 may be similar to the arrangement of components of the first and second master-slave flip-flops 122 and 124, and thus, a description thereof will not be repeated here.

The components of the flip-flop 300 may be connected to each other by metal routing. For example, the components of the flip-flop 300 may be connected to each other by lines including a metal line. How the components of the flip-flop 300 are connected to each other by the lines will be described below.

The common clock generator 341 may be connected with the first, second, third, and fourth master latches 323_1, 343_1, 346_1, and 326_1. The common clock generator 341 may be connected with the first, second, third, and fourth slave latches 323_2, 343_2, 346_2, and 326_2. The common select signal generator 321 may be connected with the first, second, third, and fourth multiplexers 322, 342, 345, and 325. The first, second, third, and fourth multiplexers 322, 342, 345, and 325 may be connected with the first, second, third, and fourth master latches 323_1, 343_1, 346_1, and 326_1, respectively. The first, second, third, and fourth master-slave flip-flops 323, 343, 346, and 326 may be connected with the first, second, third, and fourth output units 324, 344, 347, and 327, respectively.

The first output unit 324 may be connected with the second multiplexer 342. The second output unit 344 may be connected with the third multiplexer 345. The third output unit 347 may be connected with the fourth multiplexer 325. That is, the N-th output unit may be connected with the (N+1)-th multiplexer ("N" being an integer from "1" to "3"). An exemplification in which the N-th output unit is connected with the (N+1)-th multiplexer is illustrated in FIG. 3, but the exemplification may be only an embodiment of the disclosure. The disclosure may include all embodiments in which an N-th master-slave flip-flop and an (N+1)-th multiplexer are connected ("N" being an integer from "1" to "3"). An exemplification in which "N" ranges from "1" to "3" is illustrated in FIG. 3, but the exemplification may be only an embodiment of the disclosure. The disclosure may include all embodiments in which "N" is not less than 1.

Components of the first and second rows may be connected with at least one of the first and third bias rails 310 and 350. For example, the components of the first row may be connected with the first bias rail 310, and the components of the second row may be connected with the third bias rail 350. The components of the first and second rows may be connected with the second bias rail 330.

The components of the first and second rows may be supplied with the bias voltage VDD from at least one of the first and third bias rails 310 and 350. For example, the components of the first row may be supplied with the bias voltage VDD from the first bias rail 310, and the components of the second row may be may be supplied with the bias voltage VDD from the second bias rail 350. The components of the first and second rows may be supplied with the bias voltage VSS from the second bias rail 330.

For example, the bias voltage VDD and the bias voltage VSS may be fixed in level. Alternatively, the bias voltage VDD and the bias voltage VSS may be variable in level.

A connection relationship between components of the first, second, third, and fourth master-slave flip-flops 323, 343, 346, and 326 and components of the first, second, third, and fourth output units 324, 344, 347, and 327 may be similar to a connection relationship between the first and second master-slave flip-flops 122 and 124 and the first and second output units 123 and 125 of FIG. 1, and thus, a description thereof will not be repeated here.

Figure 4:
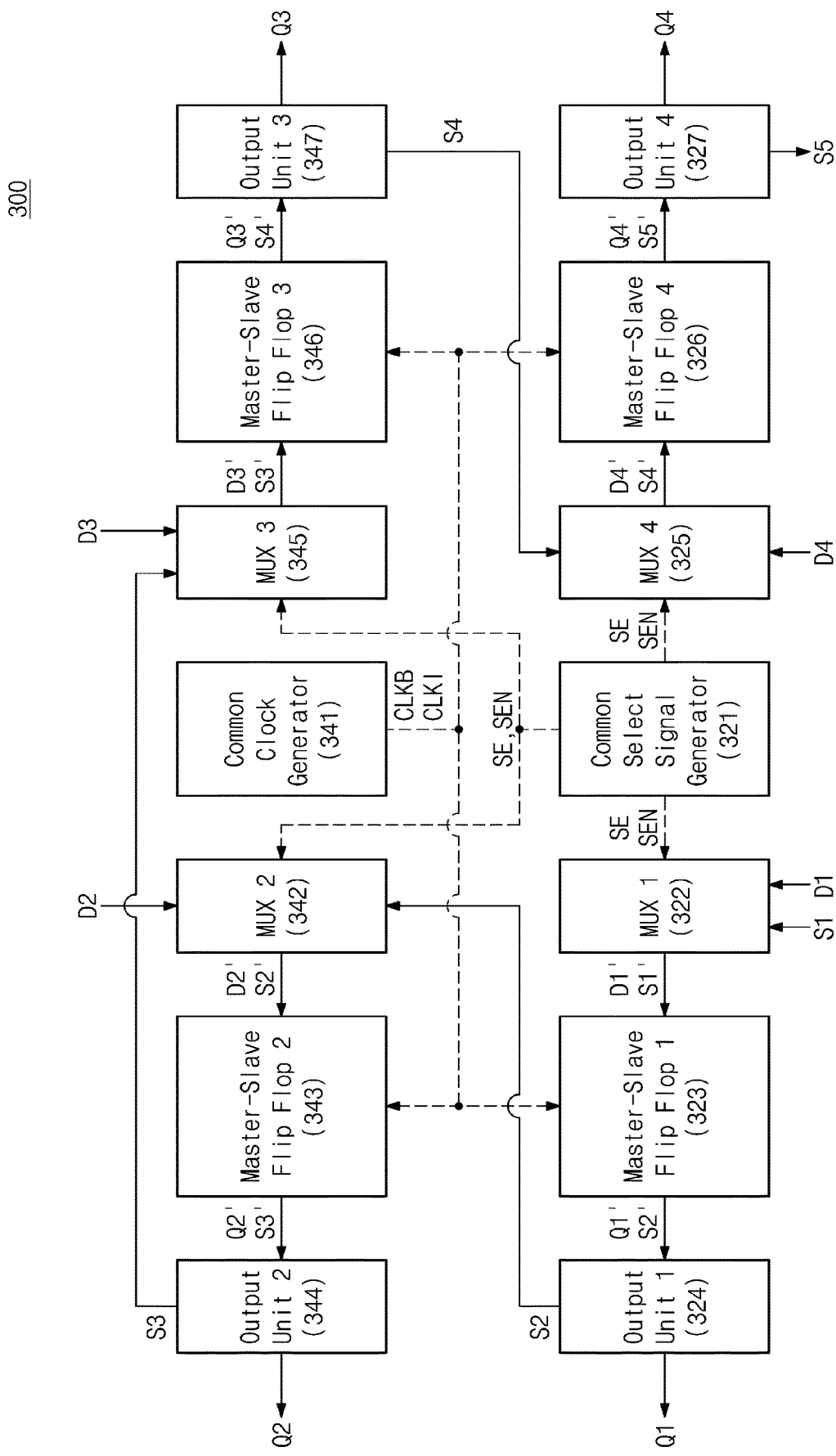
FIG. 4 is a block diagram illustrating an exemplary operation of the flip-flop of FIG. 3.

FIG. 4 is a block diagram illustrating an exemplary operation of a flip-flop of FIG. 3. As described with reference to FIG. 3, signals of FIG. 4 may be transmitted by lines including a metal line.

Referring to FIG. 4, each of the first, second, third, and fourth multiplexers 322, 342, 345, and 325 may selectively output one of the corresponding input signal of input signals D1 to D4 and the corresponding scan signal of scan signals S1 to S4 under control of the common select signal generator 321. For example, each of the first, second, third, and fourth multiplexers 322, 342, 345, and 325 may selectively output one of a logical value of the corresponding input signal of the input signals D1 to D4 and a logical value of the corresponding scan signal of the scan signals S1 to S4 under control of the common select signal generator 321.

The first to fourth input signals D1 to D4 may be received from external electronic circuits. For example, the first to fourth input signals D1 to D4 may be received from logic circuits (e.g., other flip-flops) for processing data. The first, second, third, and fourth scan signals S1, S2, S3, and S4 may be directly input to the first, second, third, and fourth master-slave flip-flops 323, 343, 346, and 326. For example, the first to fourth scan signals S1 to S4 may be used to test whether the flip-flop 300 operates normally.

The common select signal generator 321 may output a select signal SE and an inverted select signal SEN. The common select signal generator 321 may control the first, second, third, and fourth multiplexers 322, 342, 345, and 325 by using the select signal SE and the inverted select signal SEN. For example, the common select signal generator 321 may include one or more inverters for outputting the select signal SE and the inverted select signal SEN.

Each of the first, second, third, and fourth multiplexers 322, 342, 345, and 325 may receive the select signal SE and the inverted select signal SEN from the common select signal generator 321. Each of the select signal SE and the inverted select signal SEN may have one of two complementary logical values. In addition, logical values of the select signal SE and the inverted select signal SEN may be complementary. For example, under control of the common select signal generator 321, the select signal SE may have a logical high value, and the inverted select signal SEN may have a logical low value. Alternatively, the select signal SE may have a logical low value, and the inverted select signal SEN may have a logical high value.

Each of the first, second, third, and fourth multiplexers 322, 342, 345, and 325 may output a signal having a logical value corresponding to one of logical values of the input signals D1 to D4 in response to a logical low value of select signal SE and a logical high value of inverted select signal SEN. For example, each of the first, second, third, and fourth multiplexers 322, 342, 345, and 325 may output a signal having a complementary logical value, D1' to D4', to a logical value of the corresponding one of the input signals D1 to D4. For example, in the case where the first input signal D1 has a logical high value, the first multiplexer 322 may output a signal D1' having a logical low value. Alternatively, in the case where the first input signal D1 has a logical low value, the first multiplexer 322 may output the signal D1' having a logical high value.

In the example of FIG. 4, the first, second, third, and fourth multiplexers 322, 342, 345, and 325 may receive the first, second, third, and fourth input signals D1, D2, D3, and D4, respectively. The first, second, third, and fourth multiplexers 322, 342, 345, and 325 may output signals D1', D2', D3', and D4' each having a logical value corresponding to a logical value of the corresponding one of the input signals D1, D2, D3, and D4 in response to the logical low value of the select signal SE and the logical high value of the inverted selection signal SEN. The first, second, third, and fourth master-slave flip-flops 323, 343, 346, and 326 may output first, second, third, and fourth output signals Q1', Q2', Q3' and Q4', and the first, second, third, and fourth output units 324, 344, 347, and 327 may output first, second, third, and fourth output signals Q1, Q2, Q3 and Q4, in response to receiving signals Q1', Q2', Q3' and Q4', by a method similar to the method described with reference to FIG. 2.

The first, second, third, and fourth multiplexers 322, 342, 345, and 325 may output signals S1', S2', S3', and S4' each having a logical value corresponding to a logical value of the corresponding one of the scan signals S1, S2, S3, and S4 in response to the logical high value of the select signal SE and the logical low value of the inverted selection signal SEN. Below, an operation of the flip-flop 300 according to an input of the first scan signal S1 will be described.

For example, a designer may input the first scan signal S1 having a logical high value to the first multiplexer 322 for the purpose of testing the flip-flop 300. In the case where the first scan signal S1 has the logical high value, the first multiplexer 322 may output a signal S1' having a logical low value. Alternatively, in the case where the first scan signal S1 has the logical low value, the first multiplexer 322 may output the signal S1' having the logical high value.

The common select signal generator 321 may output the select signal SE having the logical high value and the inverted select signal SEN having the logical low value to the first multiplexer 322. The first multiplexer 322 may output the signal S1' having the logical high value, in response to the select signal SE having the logical high value and the inverted select signal SEN having the logical low value to the first master-slave flip-flop 323. The first master-slave flip-flop 323 may output the signal S2' having the logical low value to the first output unit 323 by a method similar to the method described with reference to FIG. 2. The first output unit 324 may output the signal S2 having the logical high value.

The second multiplexer 324 may receive the signal S2 having the logical high value from the first output unit 324. The common select signal generator 321 may output the select signal SE having the logical high value and the inverted select signal SEN having the logical low value to the second multiplexer 342. The second multiplexer 342 may output the signal S2' having the logical low value to the second master latch 343_1 in response to the select signal SE having the logical high value and the inverted select signal SEN having the logical low value. The second master-slave flip-flop 343 may output the signal S3' having the logical low value to the first output unit 323 by a method similar to the method described with reference to FIG. 2. The second output unit 344 may output the signal S3 having the logical high value.

As in the above description, the third multiplexer 345 may receive the signal S3 having the logical high value from the second output unit 344, and the third output unit 347 may output the signal S4 having the logical high value. In addition, the fourth multiplexer 325 may receive the signal S4 having the logical high value from the third output unit 347, and the fourth output unit 327 may output the signal S5 having the logical high value.

Through the operation of the flip-flop 300 described above with reference to FIG. 4, the designer may test whether the first, second, third, and fourth master-slave flip-flops 323, 343, 346, and 326 operate normally. After the test operation described with reference to FIG. 4 terminates, the common select signal generator 321 may output the select signal SE having the logical low value and the inverted select signal SEN having the logical high value to the first, second, third, and fourth multiplexers 322, 342, 345, and 325. The first, second, third, and fourth multiplexers 322, 342, 345, and 325 may output signals corresponding to the received input signals in response to the select signal SE having the logical low value and the inverted select signal SEN having the logical high value.

Figure 5:
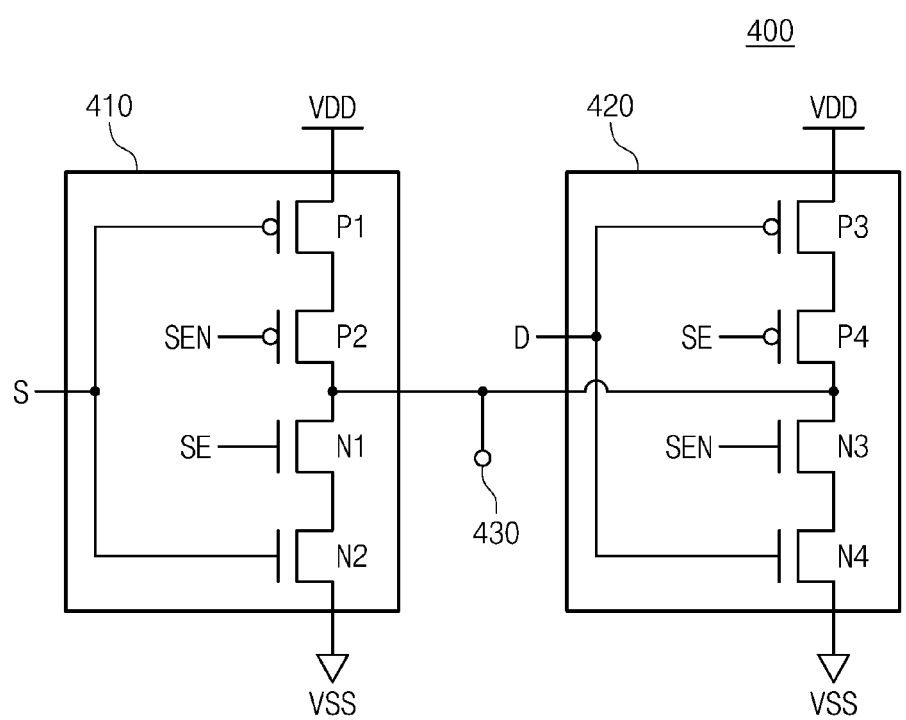
FIG. 5 is a circuit diagram illustrating an exemplary configuration of first to fourth multiplexers of FIG. 3.

FIG. 5 is a circuit diagram illustrating an exemplary configuration of first, second, third, and fourth multiplexers 322, 342, 345, and 325 of FIG. 3. Each of the first, second, third, and fourth multiplexers 322, 342, 345, and 325 of FIG. 3 may include a multiplexer 400 of FIG. 5. Referring to FIG. 5, the multiplexer 400 may include a scan signal input unit 410, a data input unit 420, and an output terminal 430.

The scan signal input unit 410 may include a transistor N1, a transistor N2, a transistor P1, and a transistor P2. In the example of FIG. 5, the transistor N1 and the transistor N2 may include an N-type metal oxide semiconductor field effect transistor (N-MOSFET). The transistor P1 and the transistor P2 may include a P-type metal oxide semiconductor field effect transistor (P-MOSFET). The data input unit 420 may include a transistor N3, a transistor N4, a transistor P3, and a transistor P4. In the example of FIG. 5, the transistor N3 and the transistor N4 may include an N-MOSFET. The transistor P3 and the transistor P4 may include a P-MOSFET.

Referring to FIG. 5, the transistors P1, P2, N1, and N2 of the scan signal input unit 410 may be serially connected. In more detail, the transistor P1 may be supplied with the bias voltage VDD through one end thereof. For example, the transistor P1 may be supplied with the bias voltage VDD through at least one of the first bias rail 310 and the third bias rail 350. An opposite end of the transistor P1 may be connected with one end of the transistor P2. An opposite end of the transistor P2 may be connected with the output terminal 430 and one end of the transistor N1. An opposite end of the transistor N1 may be connected with one end of the transistor N2. The transistor N2 may be supplied with the bias voltage VSS through an opposite end thereof. For example, the transistor N2 may be supplied with the bias voltage VSS through the second bias rail 330.

Referring to FIG. 5, the transistors P3, P4, N3, and N4 of the data input unit 420 may be serially connected. A connection relationship between the transistor P3, the transistor P4, the transistor N3, and the transistor N4 is similar to the connection relationship between the transistor P1, the transistor P2, the transistor N1, and the transistor N2, and thus, a description thereof will not be repeated here.

The scan signal input unit 410 may output a signal having a logical value corresponding to a logical value of a scan signal under control of the common select signal generator 321, and the data input unit 420 may output a signal having a logical value corresponding to a logical value of a data signal under control of the common select signal generator 321. Below, how signals are output from the scan signal input unit 410 and the data input unit 420 will be described.

In the scan signal input unit 410, the scan signal "S" may be input to gate terminals of the transistor P1 and the transistor N2. The select signal SE may be input to a gate terminal of the transistor N1. The inverted select signal SEN may be input to a gate terminal of the transistor P2.

The transistor P1 may be turned on in response to a logical low value of the scan signal "S". The transistor N2 may be turned on in response to a logical high value of the scan signal "S". The transistor P2 may be turned on in response to a logical low value of the inverted select signal SEN. The transistor N1 may be turned on in response to a logical high value of the select signal SE.

In the data input unit 420, the input signal "D" may be input to gate terminals of the transistor P3 and the transistor N4. The input signal "D" of FIG. 5 may include an input signal of FIG. 2. The select signal SE may be input to a gate terminal of the transistor P4. The inverted select signal SEN may be input to a gate terminal of the transistor N3.

The transistor P3 may be turned on in response to a logical low value of the input signal "D". The transistor N4 may be turned on in response to a logical high value of the input signal "D". The transistor P4 may be turned on in response to a logical low value of the select signal SE. The transistor N3 may be turned on in response to a logical high value of the inverted select signal SE.

For example, the select signal SE may have a logical high value, and the inverted select signal SEN may have a logical low value. The transistor P2 and the transistor N1 of the scan signal input unit 410 may be turned on. The transistor P4 and the transistor N3 of the data input unit 420 may be turned off. Accordingly, the multiplexer 400 may output a signal having a specific logical value through the output terminal 430 depending on the transistor P1 and the transistor N2 of the scan signal input unit 410.

In the case where the scan signal "S" has the logical high value, the transistor P1 may be turned off, and the transistor N2 may be turned on. Accordingly, the bias voltage VSS may be supplied to the output unit 430 through the transistor N1 and the transistor N2. A signal output from the output terminal 430 may have the logical low value by the bias voltage VSS.

In the case where the scan signal "S" has the logical low value, the transistor P1 may be turned on, and the transistor N2 may be turned off. Accordingly, the bias voltage VDD may be supplied to the output unit 430 through the transistor P1 and the transistor P2. A signal output from the output terminal 430 may have the logical high value by the bias voltage VDD.

For example, the select signal SE may have the logical low value, and the inverted select signal SEN may have the logical high value. The transistor P4 and the transistor N3 of the data input unit 420 may be turned on. The transistor P2 and the transistor N1 of the scan signal input unit 410 may be turned off. Accordingly, the multiplexer 400 may output a signal having a specific logical value through the output terminal 430 depending on the transistor P3 and the transistor N4 of the data input unit 420. An operation of the data input unit 420 according to a logical value of the input signal "D" is similar to an operation of the scan signal input unit 410 according to a logical value of the scan signal "S", and thus, a description thereof will not be repeated here.

The multiplexer 400 of FIG. 5 may be an embodiment for describing the first to fourth multiplexers of FIG. 3, and the disclosure may include all multiplexers configured to selectively output signals corresponding to the scan signal "S" and the input signal "D".

Figure 6:
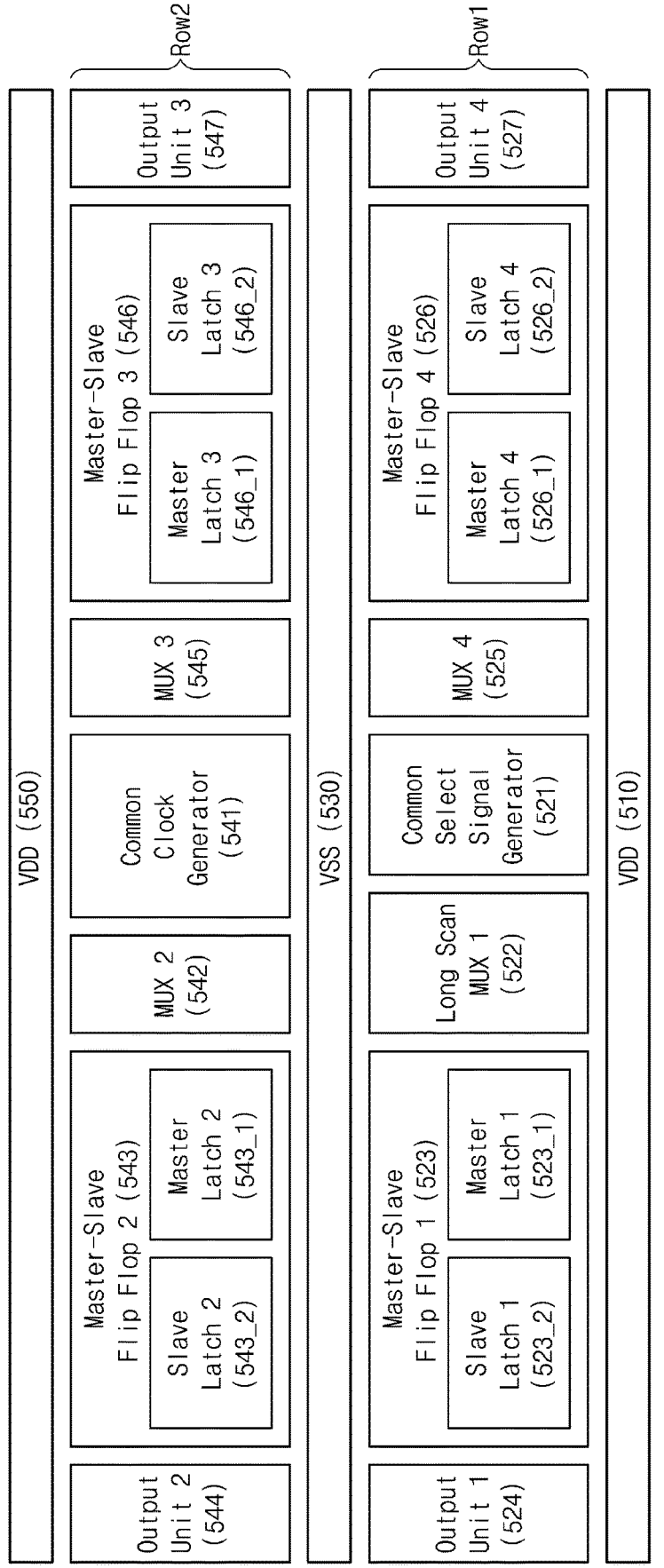
FIG. 6 is a block diagram illustrating arrangement of the flip-flop according to an embodiment of the disclosure.

FIG. 6 is a block diagram illustrating arrangement of a flip-flop according to an embodiment of the disclosure.

Referring to FIGS. 3 and 6, a flip-flop 500 of FIG. 6 may include a first multiplexer 522 for long scan instead of the first multiplexer 322. Hereinafter, a multiplexer for long scan may be referred to as a "long scan multiplexer". The first long scan multiplexer 522 of FIG. 6 may be displayed in the larger area than the first multiplexer 322. In addition, a common select signal generator 521 of FIG. 6 may be displayed in the smaller area than the common select signal generator 321 of FIG. 3. For example, the number transistors of the first long scan multiplexer 522 of FIG. 6 may be more than that of the first multiplexer 322 of FIG. 3. The number of transistors of the common select signal generator 521 of FIG. 6 may be less than that of the common select signal generator 321 of FIG. 3.

Accordingly, a speed at which the first long scan multiplexer 522 of FIG. 6 outputs a signal may be slower than a speed at which the first multiplexer 322 of FIG. 3 outputs a signal. A process in which a signal is output by the first long scan multiplexer 522 will be more fully described with reference to FIG. 8.

As in the above description given with reference to FIG. 4, the flip-flop 500 of FIG. 6 may receive the input signals D1, D2, D3, and D4 through master-slave flip-flops 523, 543, 546, and 526. In addition, the flip-flop 500 of FIG. 6 may receive the scan signals S1, S2, S3, and S4 through master-slave flip-flops 523, 543, 546, and 526.

Before the first to fourth input signals D1 to D4 are input to the flip-flop 500, a specific time may be needed for other electronic circuits to process the first to fourth input signals D1 to D4. However, since the scan signals S1, S2, S3, and S4 are directly input to the master-slave flip-flops 323, 343, 346, and 326, the flip-flop 500 may receive the first to fourth scan signals S1 to S4 more quickly than the first to fourth input signals D1 to D4.

A designer may allow the flip-flop 500 to receive the first to fourth scan signals S1 to S4 more slowly by using the first long scan multiplexer 522. The designer may allow a time, which is taken for a signal to be output from the first long scan multiplexer 522, to correspond to a time when the first to fourth input signals D1 to D4 are processed by other electronic circuits. Accordingly, the designer may obtain a test environment more similar to a use environment by using the first long scan multiplexer 522 instead of the first multiplexer 322.

An exemplification in which the first long scan multiplexer 522 is used instead of the first multiplexer 322 is described with reference to FIG. 6. However, the disclosure may include all embodiments in which a long scan multiplexer is used instead of at least one of the multiplexers 322, 342, 345, and 325 of FIG. 3.

The common clock generator 541, first master latch 523_1, first slave latch 523_2, first output unit 524, second multiplexer 542, second master latch 543_1, second slave latch 543_2, second output unit 544, third multiplexer 545, third master latch 546_1, third slave latch 546_2, third output unit 547, fourth multiplexer 525, fourth master latch 526_1, fourth slave latch 526_2, fourth output unit 527, first bias rail 510, second bias rail 530, and third bias rail 550 of FIG. 6 may be similar to the common clock generator 341, first master latch 323_1, first slave latch 323_2, first output unit 324, second multiplexer 342, second master latch 343_1, second slave latch 343_2, second output unit 344, third multiplexer 345, third master latch 346_1, third slave latch 346_2, third output unit 347, fourth multiplexer 325, fourth master latch 326_1, fourth slave latch 326_2, fourth output unit 327, first bias rail 310, second bias rail 330, and third bias rail 350 of FIG. 3. The physical configuration of the similar components of FIGS. 3 and 6 may also be similar. Accordingly, with respect to FIG. 6, the descriptions of the similar components and configuration may be found in the description of FIG. 3.

Figure 7:
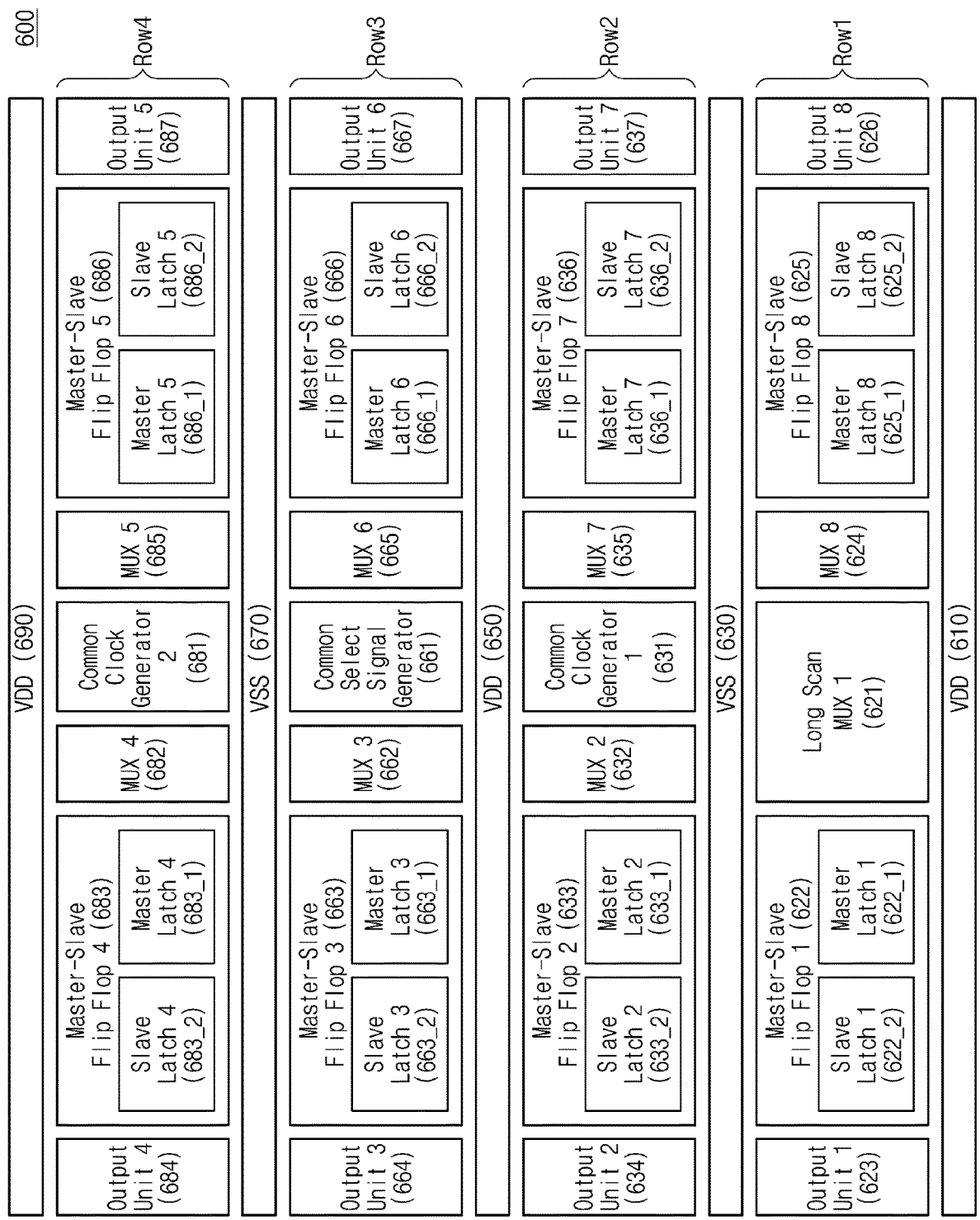
FIG. 7 is a block diagram illustrating arrangement of the flip-flop according to an embodiment of the disclosure.

FIG. 7 is a block diagram illustrating arrangement of a flip-flop according to an embodiment of the disclosure.

A flip-flop 600 may include first, second, third, and fourth rows. The first row may include a first long scan multiplexer 621, a first master-slave flip-flop 622, a first output unit 623, an eighth multiplexer 624, an eighth master-slave flip-flop 625, and an eighth output unit 626. The second row may include a second multiplexer 632, a second master-slave flip-flop 633, a second output unit 634, a seventh multiplexer 635, a seventh master-slave flip-flop 636, a seventh output unit 637, and a first common clock generator 631. The third row may include a third multiplexer 662, a third master-slave flip-flop 663, a third output unit 664, a sixth multiplexer 665, a sixth master-slave flip-flop 666, a sixth output unit 667, and a common select signal generator 661. The fourth row may include a fourth multiplexer 682, a fourth master-slave flip-flop 683, a fourth output unit 684, a fifth multiplexer 685, a fifth master-slave flip-flop 686, a fifth output unit 687, and a second common clock generator 681.

The flip-flop 600 of FIG. 7 is only an embodiment of the disclosure, and the disclosure may include all flip-flops of one or more master-slave flip-flops. In addition, the disclosure may include all flip-flops of a long scan multiplexer instead of at least one of the multiplexers 632, 662, 682, 685, 665, 635, and 624 and a first multiplexer similar to the multiplexers 632, 662, 682, 685, 665, 635, and 624 instead of the first long scan multiplexer 621.

Each of the master-slave flip-flops 622, 633, 663, 683, 686, 666, 636, and 625 may include components similar to components of each of the master-slave flip-flops 323, 343, 346, and 326. For example, each of first master latch 622_1, second master latch 633_1, third master latch 663_1, fourth master latch 683_1, fifth master latch 686_1, sixth master latch 666_1, seventh master latch 636_1, and eighth master latch 625_1 may be similar to first master latch 323_1 of FIG. 3. And each of first slave latch 622_2, second slave latch 633_2, third slave latch 663_2, fourth slave latch 683_2, fifth slave latch 686_2, sixth slave latch 666_2, seventh slave latch 636_2, and eighth slave latch 625_2 may be similar to first slave latch 323_2 of FIG. 3. First bias rail 610, third bias rail 650, and fifth bias rail 690 may be similar to any of first bias rail 310 and third bias rail 350 of FIG. 3. And second bias rail 630 and fourth bias rail 670 may be similar to second bias rail 330 of FIG. 3. Thus, a description thereof will not be repeated here.

The relationship between the first direction "X", the second direction "Y", and the third direction "Z" may be similar to the description given with reference to FIG. 1, and thus, a description thereof will not be repeated here.

The first long scan multiplexer 621, a first master latch 622_1, a second slave latch 622_2, and the first output unit 623 of the first row may be arranged in order along the first direction "X". The eighth multiplexer 624, an eighth master latch 625_1, an eighth slave latch 625_2, and the eighth output unit 626 of the first row may be arranged in order along the second direction "Y". The arrangements of components of the second and fourth rows of FIG. 7 are similar to the arrangement of the components of the first row, and thus, a description thereof will not be repeated here. The arrangement of components of the third and fourth rows of FIG. 7 is similar to the arrangement of the components of the second row of FIG. 3, and thus, a description thereof will not be repeated here. The arrangement of the master-slave flip-flops 622, 633, 663, 683, 686, 666, 636, and 625 is similar to the arrangement described with reference to FIG. 3, and thus, a description thereof will not be repeated here.

However, the arrangement of the common select signal generator 661 and the common clock generators 631 and 681 included in the flip-flop 600 of FIG. 7 may be an embodiment of the disclosure, and the disclosure may include all exemplary flip-flops in which at least one common select signal generator and at least one common clock generator are respectively disposed at locations of the common select signal generator 661 and the common clock generators 631 and 681 of the flip-flop 600.

A fifth bias rail 690, the fourth row, a fourth bias rail 670, the third row, a third bias rail 650, the second row, a second bias rail 630, the first row, and a first bias rail 610 may be arranged in order along the third direction "Z".

The components of the master-slave flip-flops 622, 633, 663, 683, 686, 666, 636, and 625 may be disposed along a flow of data. The arrangement of the components of the master-slave flip-flops 622, 633, 663, 683, 686, 666, 636, and 625 may be similar to the arrangement of the components of the master-slave flip-flops 323, 343, 346, and 326, and thus, a description thereof will not be repeated here.

The first, third, and fifth bias rails 610, 650, and 690 may supply the bias voltage VDD. The second and fourth bias rails 630 and 670 may supply the bias voltage VSS. The bias voltage VDD or the bias voltage VSS may be supplied from a device such as a voltage generator or the like.

The components of the flip-flop 600 may be connected to each other by metal routing. The master-slave flip-flops 622, 633, 663, 683, 686, 666, 636, and 625 may be connected with at least one of the first and second common clock generators 631 and 681. For example, the first, second, seventh, and eighth master-slave flip-flops 622, 633, 636, and 625 may be connected with the first common clock generator 631. In addition, the third, fourth, fifth, and sixth master-slave flip-flops 663, 683, 686, and 666 may be connected with the second common clock generator 681. The common select signal generator 661 may be connected with the multiplexers 632, 662, 682, 685, 665, 635, and 624 and the first long scan multiplexer 621.

The components of the first to fourth rows may be connected with at least one of the first, third, and fifth bias rails 610, 650, and 690. The components of the first to fourth rows may be connected with at least one of the second and fourth bias rails 630 and 670.

For example, the components of the first row may be connected with the first bias rail 610 and the second bias rail 630. The components of the second row may be connected with the third bias rail 650 and the second bias rail 630. The components of the third row may be connected with the third bias rail 650 and the fourth bias rail 670. The components of the fourth row may be connected with the fifth bias rail 690 and the fourth bias rail 670.

The components of the first to fourth rows of the flip-flop 600 may be supplied with the bias voltage VDD from at least one of the first, third, and fifth bias rails 610, 650, and 690. The components of the first to fourth rows of the flip-flop 600 may be supplied with the bias voltage VSS from at least one of the second and fourth bias rails 630 and 670.

For example, the components of the first row may be supplied with the bias voltage VDD from the first bias rail 610, and the components of the second row may be may be supplied with the bias voltage VSS from the second bias rail 630. The components of the second row may be supplied with the bias voltage VDD from the third bias rail 650 and may be supplied with the bias voltage VSS from the second bias rail 630. The components of the third row may be supplied with the bias voltage VDD from the third bias rail 650 and may be supplied with the bias voltage VSS from the fourth bias rail 670. The components of the fourth row may be supplied with the bias voltage VDD from the fifth bias rail 690 and may be supplied with the bias voltage VSS from the fourth bias rail 670.

For example, the bias voltage VDD and the bias voltage VSS may be fixed in level. Alternatively, the bias voltage VDD and the bias voltage VSS may be variable in level.

A connection relationship between components of the master-slave flip-flops 622, 633, 663, 683, 686, 666, 636, and 625 and components of the output units 623, 634, 664, 684, 687, 667, 637, and 626 may be similar to a connection relationship between the first and second master-slave flip-flops 122 and 124 and the first and second output units 123 and 125, and thus, a description thereof will not be repeated here.

In the example of FIG. 7, the first long scan multiplexer 621 and the multiplexers 632, 662, 682, 685, 665, 635, and 624 may receive a clock and an inverted clock from at least one of the first and second common clock generators 631 and 681. For example, the first long scan multiplexer 621, the second multiplexer 631, the seventh multiplexer 645, and the eighth multiplexer 624 may receive the clock and the inverted clock from the first common clock generator 631. The remaining multiplexers 662, 682, 685, and 665 may receive the clock and the inverted clock from the second common clock generator 681. In the example of FIG. 7, the first long scan multiplexer 621 and the multiplexers 632, 662, 682, 685, 665, 635, and 624 may receive a select signal and an inverted select signal from the common select signal generator 661.

An operation of the flip-flop 600 of FIG. 7 is similar to the operation described with reference to FIG. 4, and thus, a description thereof will not be repeated here.

Referring to FIG. 7, each of the master-slave flip-flops 622, 633, 663, 683, 686, 666, 636, and 625 may not include a corresponding clock generator. Instead, the master-slave flip-flops 622, 633, 663, 683, 686, 666, 636, and 625 may share two common clock generators 631 and 681.

As described with reference to FIG. 1, as the number of common clock generators decreases, the flip-flop 600 may consume less power and may be disposed in a smaller area.

In addition, any other component(s) may be disposed instead of a common clock generator. For example, the first long scan multiplexer 621 may be disposed in the first row instead of a common clock generator and a common select signal generator. As described with reference to FIG. 6, a designer may obtain a better test environment by the first long scan multiplexer 621.

Figure 8:
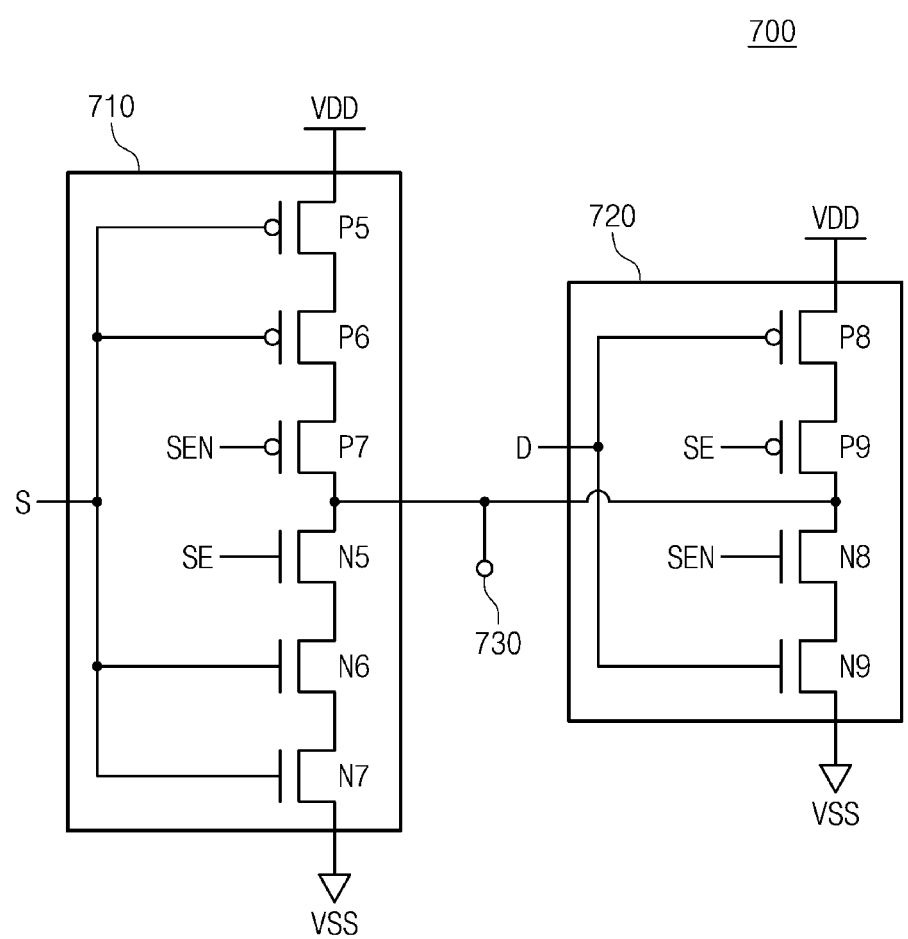
FIG. 8 is a circuit diagram illustrating an exemplary configuration of a first long scan multiplexer of FIG. 7.

FIG. 8 is a circuit diagram illustrating an exemplary configuration of a first long scan multiplexer of FIG. 7. Each of the first long scan multiplexer 522 of FIG. 6 and the first long scan multiplexer 621 of FIG. 7 may include a long scan multiplexer 700 of FIG. 8.

The long scan multiplexer 700 may include a long scan signal input unit 710, a data input unit 720, and an output terminal 730. The long scan signal input unit 710 may include a transistor N5, a transistor N6, a transistor N7, a transistor P5, a transistor P6, and a transistor P7. The data input unit 720 may include a transistor N8, a transistor N9, a transistor P8, and a transistor P9. In the example of FIG. 8, each of the transistor N5 to the transistor N9 may include at least one N-MOSFET. Each of the transistor P5 to the transistor P9 may include at least one P-MOSFET.

In the long scan signal input unit 710, the transistor P5 may receive the bias voltage VDD through one end thereof. The transistor P5 may receive the bias voltage VDD through at least one of the first, third, and fifth bias rails 610, 650, and 690 of FIG. 7. An opposite end of the transistor P5 may be connected with one end of the transistor P6. An opposite end of the transistor P6 may be connected with one end of the transistor P7. An opposite end of the transistor P7 may be connected with the output terminal 730 and one end of the transistor N5. An opposite end of the transistor N5 may be connected with one end of the transistor N6. An opposite end of the transistor N6 may be connected with one end of the transistor N7. The transistor N7 may receive the bias voltage VSS through an opposite end thereof. The transistor N7 may receive the bias voltage VSS through at least one of the second and fourth bias rails 630 and 670 of FIG. 7.

A connection relationship of components of the data input unit 720 of FIG. 8 is similar to that of the data input unit of FIG. 5, and thus, a description thereof will not be repeated here.

In the long scan signal input unit 710, the scan signal "S" may be input to gate terminals of the transistor P5, the transistor P6, the transistor N6, and the transistor N7. The select signal SE may be input to a gate terminal of the transistor N5. The inverted select signal SEN may be input to a gate terminal of the transistor P7.

An operation of the long scan multiplexer 700 of FIG. 8 according to a logical value of the scan signal "S" is similar to the operation of the multiplexer 400 of FIG. 5, and thus, a description thereof will not be repeated here. However, since the number of serially connected transistors of the long scan signal input unit 710 of FIG. 8 is more than that of the scan signal input unit 410 of FIG. 5, the long scan signal input unit 710 of FIG. 8 may output a signal more slowly than the scan signal input unit 410 of FIG. 5.

That is, a time taken for the bias voltage VDD of FIG. 8 to be transmitted to the output terminal 730 through the transistor P5 to P7 may be longer than a time taken for the bias voltage VDD of FIG. 5 to be transmitted to the output terminal 430 through the transistor P1 and P2. In addition, a time taken for the bias voltage VSS of FIG. 8 to be transmitted to the output terminal 730 through the transistor N5 to N7 may be longer than a time taken for the bias voltage VSS of FIG. 5 to be transmitted to the output terminal 430 through the transistor N1 and N2.

However, the long scan multiplexer 700 of FIG. 8 may be an embodiment for describing the first long scan multiplexer 522 of FIG. 6 and the first long scan multiplexer 621 of FIG. 6, and the disclosure may include all multiplexers configured to selectively output signals corresponding to the scan signal "S" and the input signal "D". For example, the long scan input unit 710 may include "m" transistors serially connected (m being a natural number).

Figure 9:
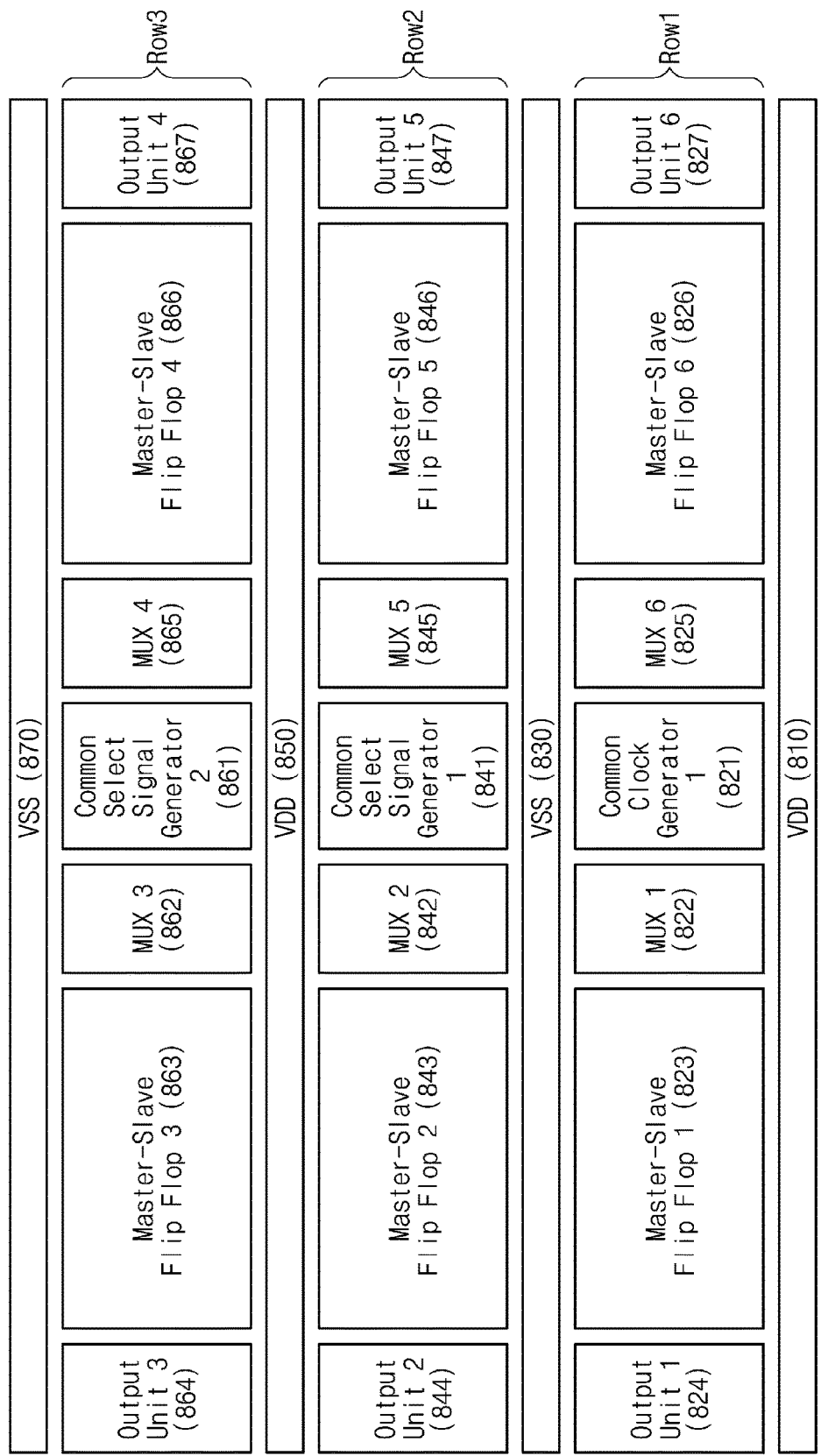
FIG. 9 is a block diagram illustrating arrangement of the flip-flop according to an embodiment of the disclosure.

FIG. 9 is a block diagram illustrating arrangement of a flip-flop according to an embodiment of the disclosure.

The flip-flop 100 including two master-slave flip-flops is described with reference to FIG. 1, the flip-flops 300 and 500 each including four master-slave flip-flops are described with reference to FIGS. 3 and 6, and the flip-flop 600 including eighth master-slave flip-flops are described with reference to FIG. 7. However, the disclosure may include all exemplifications of a flip-flop including "N" master-slave flip-flops (N being a natural number).

For example, a flip-flop 800 of FIG. 9 may include six master-slave flip-flops 823, 843, 863, 866, 846, and 826, six multiplexers 822, 842, 862, 865, 845, and 825, six output units 824, 844, 864, 867, 847, and 827, a common clock generator 821, and common select signal generators 841 and 861. Arrangement, a connection relationship, operations, and functions of components and a flow of signal in the flip-flop 800 are similar to those described with reference to FIGS. 1 to 7, and thus, a description thereof will not be repeated here.

The flip-flop 800 may include the six multiplexers 822, 842, 862, 865, 845, and 825, but the disclosure may include all embodiments in which a long scan multiplexer is substituted for at least one of the six multiplexers 822, 842, 862, 865, 845, and 825. The flip-flop 800 may include the first and second common select signal generators 841 and 861, but the disclosure may include all embodiments in which at least one common clock generator is disposed. A third row, a second row, and a first row of the flip-flop 800 may be disposed in order along the third direction "Z", but the disclosure may include first to third rows disposed in any order along the third direction "Z".

The components of the first to third rows may be connected with at least one of the first and third bias rails 810, 850 to receive a voltage VDD. And the components of the first to third rows may be connected with at least one of the second and fourth bias rails 830 and 870 to receive a voltage VSS.

As described with reference to FIG. 2, one master-slave flip-flop may store a logical value in response to a clock. One logical value may be expressed by 1-bit data. Accordingly, the flip-flop 100 of FIG. 1 may be a 2-bit flip-flop, each of the flip-flops 300 and 500 of FIGS. 3 and 6 may be a 4-bit flip-flop, and the flip-flop 800 of FIG. 9 may be a 6-bit flip-flop. As described above, the disclosure may include all embodiments of an M-bit flip-flop (M being a natural number) having a similar arrangement to the arrangements of the flip-flops 100, 300, 500, 600, and 800.

Figure 10:
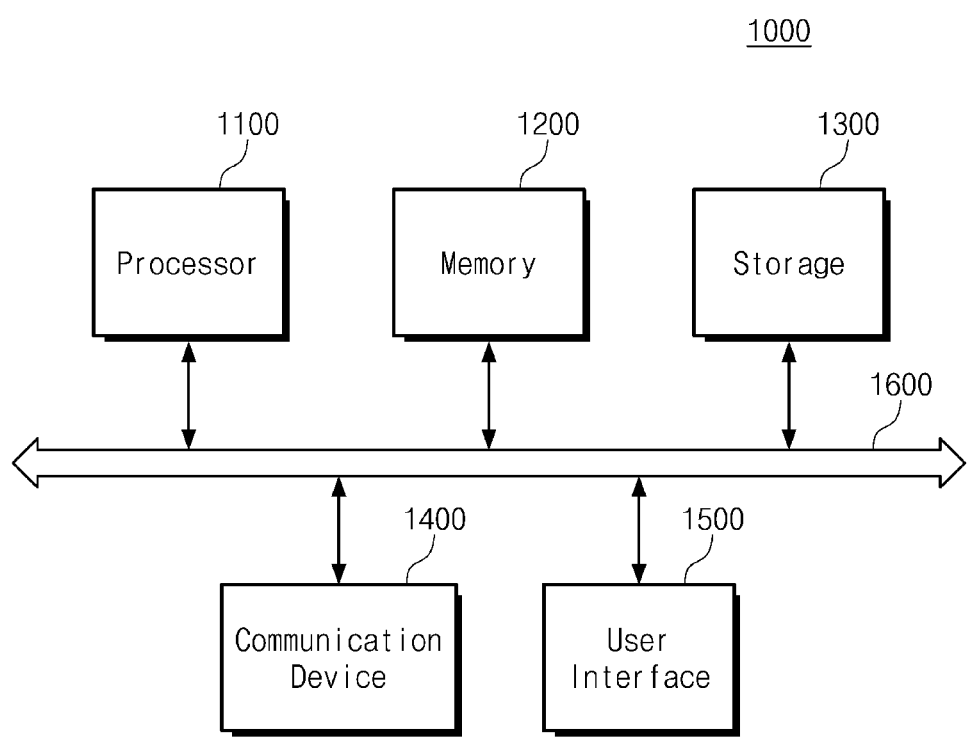
FIG. 10 is a block diagram illustrating an exemplary electronic device including the flip-flop designed according to an embodiment of the disclosure.

FIG. 10 is a block diagram illustrating an exemplary electronic device including a flip-flop designed according to an embodiment of the disclosure.

Referring to FIG. 10, an electronic device 1000 may include a processor 1100, a memory 1200, storage 1300, a communication device 1400, a user interface 1500, and a bus 1600. The electronic device 1000 may further include other components (e.g., various sensors, a power supply, and the like) that are not illustrated in FIG. 10. Alternatively, the electronic device 1000 may not include one or more of components that are illustrated in FIG. 10.

The processor 1100 may control overall operations of the electronic device 1000. The processor 1100 may process data for controlling operations of the electronic device 1000. The processor 1100 may include one or more flip-flops for the purpose of processing data. For example, the processor 110 may include at least one of the flip-flop 100 of FIG. 1, the flip-flop 300 of FIG. 3, the flip-flop 500 of FIG. 6, the flip-flop 600 of FIG. 7, and the flip-flop 900 of FIG. 9.

A designer may test operations of flip-flops included in the processor 1100. For example, the designer may input a scan signal to the flip-flop 300, the flip-flop 500, the flip-flop 600, and/or the flip-flop 800 included in the processor 1100. As described with reference to FIGS. 3 to 8, the flip-flop 300, the flip-flop 500, the flip-flop 600, and/or the flip-flop 800 may output a signal corresponding to the scan signal.

For example, the processor 1100 may be one of a general-purpose processor, a workstation processor, an application processor, etc. The processor 1100 may include a single processor core or may include a plurality of processor cores. For example, the processor 1100 may include a multi-core such as a dual-core, a quad-core, a hexa-core, or the like.

The memory 1200 may store data processed or to be processed by the processor 1100. The data processed or to be processed by the processor 1100 may be data output or to be output by at least one of the flip-flop 100 of FIG. 1, the flip-flop 300 of FIG. 3, the flip-flop 500 of FIG. 6, the flip-flop 600 of FIG. 7, and the flip-flop 900 of FIG. 9.

For example, the memory 1200 may include a volatile memory such as a static random-access memory (SRAM), a dynamic RAM (DRAM), a synchronous DRAM (SDRAM), or the like, or a nonvolatile memory such as a flash memory, a phase-change RAM (PRAM), a magneto-resistive RAM (MRAM), a resistive RAM (ReRAM), a ferroelectric RAM (FRAM), or the like. Alternatively, the memory 1200 may include heterogeneous memories.

The storage 1300 may store data regardless of power supply. For example, the storage 1300 may store data associated with data output by at least one of the flip-flop 100 of FIG. 1, the flip-flop 300 of FIG. 3, the flip-flop 500 of FIG. 6, the flip-flop 600 of FIG. 7, and the flip-flop 900 of FIG. 9.

For example, the storage 1300 may be a storage medium, which includes a nonvolatile memory, such as a hard disk drive (HDD), a solid-state drive (SSD), a secure digital (SD) card, a universal serial bus (USB) memory device, or the like.

The communication device 1400 may include a transmitter unit and a receiver unit. The electronic device 1000 may communicate with another electronic device through the communication device 1400 to transmit and/or receive data. Data transmitted/received through the communication device 1400 may be associated with data output by at least one of the flip-flop 100 of FIG. 1, the flip-flop 300 of FIG. 3, the flip-flop 500 of FIG. 6, the flip-flop 600 of FIG. 7, and the flip-flop 900 of FIG. 9.

The user interface 1500 may convey an input/output of a command or data between a user and the electronic device 1000. For example, the user interface 1500 may include a physical device such as an input device and/or an output device. The input device may include a keyboard, a mouse, a touchscreen, a scanner, a joystick, a voice recognition device, a motion recognition device, or an eyeball recognition device, and the output device may include a monitor, a display device, a projector, a speaker, or a plotter.

The bus 1600 may provide a communication path between the components of the electronic device 1000. For example, the processor 1100, the memory 1200, the storage

1300, the communication device 1400, and the user interface 1500 may exchange data with each other through the bus 1600. The bus 1600 may be configured to support various types of communication formats used in the electronic device 1000.

According to an embodiment of the disclosure, it may be possible to reduce the area of an electronic circuit including a flip-flop. Accordingly, the efficiency of designing circuits may be improved.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been described with reference to exemplary embodiments thereof, it will be apparent to those of ordinary skill in the art that various changes and modifications may be made thereto without departing from the spirit and scope of the disclosure as set forth in the following claims.

What is claimed is:

1. An electronic circuit comprising:
   a first flip-flop including a first master latch and a first slave latch arranged in order along a first direction;
   a second flip-flop including a second master latch and a second slave latch arranged in order along a second direction that is opposite to the first direction;
   a clock generator arranged between the first master latch and the second master latch and configured to output a clock to the first flip-flop and the second flip-flop;
   a first bias rail configured to supply a first bias voltage to the first flip-flop, the second flip-flop, and the clock generator; and
   a second bias rail configured to supply a second bias voltage to the first flip-flop, the second flip-flop, and the clock generator, wherein:
   the first flip-flop, the second flip-flop, and the clock generator are arranged between the first bias rail and the second bias rail, and
   the first bias rail, the clock generator, and the second bias rail are arranged in order along a third direction intersecting with the first direction and the second direction.

2. The electronic circuit of claim 1, wherein the first master latch comprises:
   a first switch configured to output a signal corresponding to an input signal to a first node in response to the clock;
   an inverter configured to output a signal having a complementary logical value to a logical value of a signal received from the first node, to a second node; and
   a second switch configured to output a signal corresponding to a signal received from the second node to the first node in response to the clock.

3. The electronic circuit of claim 2, wherein the first slave latch comprises:
   a third switch configured to output a signal corresponding to a received signal to a third node in response to the clock;
   an inverter configured to output a signal having a complementary logical value to a logical value of a signal received from the third node, to a fourth node; and
   a fourth switch configured to output a signal corresponding to a signal received from the fourth node to the third node in response to the clock.

4. The electronic circuit of claim 1, further comprising:
   a first multiplexer arranged between the first master latch and the clock generator and configured to output one of signals corresponding to a first scan signal and a first input signal to the first master latch; and
   a second multiplexer arranged between the second master latch and the clock generator and configured to output one of signals corresponding to a second scan signal and a second input signal to the second master latch.

5. The electronic circuit of claim 4, further comprising:
   a select signal generator configured to output a select signal, wherein:
   the first multiplexer selectively outputs one of the first scan signal and the first input signal in response to the select signal, and
   the second multiplexer selectively outputs one of the second scan signal and the second input signal in response to the select signal.

6. The electronic circuit of claim 5, wherein the first multiplexer comprises:
   a scan signal input circuit configured to receive the first scan signal and to output a signal having a logical value of the first scan signal in response to a first logical value of the select signal; and
   a data input circuit configured to receive the first input signal and to output a signal having a logical value of the first input signal in response to a second logical value of the select signal.

7. The electronic circuit of claim 4, wherein:
   each of the first multiplexer and the second multiplexer comprises transistors serially connected, and
   a number of the transistors included in the first multiplexer is more than a number of the transistors included in the second multiplexer.

8. An electronic circuit comprising:
   a first flip-flop configured to receive a first signal and to transmit a signal corresponding to the first signal to a first output circuit along a first direction in response to a clock;
   a second flip-flop configured to receive a second signal and to transmit a signal corresponding to the second signal to a second output circuit along a second direction that is opposite to the first direction in response to the clock; and
   a clock generator arranged between the first flip-flop and the second flip-flop and configured to generate the clock; and
   a first bias rail and a second bias rail configured to supply voltages to the first flip-flop, the second flip-flop, and the clock generator, wherein:
   the first direction is a direction that faces the first output circuit from the clock generator, the second direction is a direction that faces the second output circuit from the clock generator, the clock generator, the first flip-flop, and the second flip-flop are arranged between the first bias rail and the second bias rail, and the first bias rail, the clock generator, and the second bias rail are arranged in order along a third direction intersecting with the first direction and the second direction.

9. The electronic circuit of claim 8, wherein the clock comprises a common clock, and an inverted common clock having a complementary logical value to the common clock.

10. The electronic circuit of claim 8, wherein the first output circuit outputs a signal that has a logical value of a signal corresponding to the first signal transmitted from the first flip-flop or a complementary logical value to the logical value of the signal corresponding to the first signal.

11. An electronic circuit comprising:
a first row including a first multiplexer and a first flip-flop arranged in order along a first direction and including a second multiplexer and a second flip-flop arranged in order along a second direction;
a second row including a third multiplexer and a third flip-flop arranged in order along the first direction and including a fourth multiplexer and a fourth flip-flop arranged in order along the second direction;
a clock generator configured to output a clock to the first to fourth flip-flops; and
a select signal generator configured to output a select signal to the first to fourth multiplexers, wherein:
the clock generator is included in the first row and is arranged between the first multiplexer and the second multiplexer, and
the select signal generator is included in the second row and is arranged between the third multiplexer and the fourth multiplexer.

12. The electronic circuit of claim 11, wherein the first multiplexer is configured to output a signal more slowly than the second multiplexer.

13. The electronic circuit of claim 11, wherein the first multiplexer is connected to the first flip-flop, the first flip-flop is connected to the second multiplexer, the second multiplexer is connected to the second flip-flop, the second flip-flop is connected to the third multiplexer, the third multiplexer is connected to the third flip-flop, the third flip-flop is connected to the fourth multiplexer, and the fourth multiplexer is connected to the fourth flip-flop.

14. The electronic circuit of claim 11, wherein:
the first flip-flop is arranged at a location symmetrical to a location of the second flip-flop with respect to the clock generator, and
the third flip-flop is arranged at a location symmetrical to a location of the fourth flip-flop with respect to the selection signal generator.

15. The electronic circuit of claim 11, further comprising:
a bias rail for supplying a bias voltage to the first flip-flop, the second flip-flop, the third flip-flop, and the fourth flip-flop, wherein:
the bias rail is arranged between the first row and the second row, and
the clock generator and the select signal generator are arranged at locations that are symmetrical to each other with respect to the bias rail.

16. The electronic circuit of claim 11, wherein:
the first multiplexer receives a scan signal according to control of the select signal generator and outputs a signal corresponding to the scan signal to the first flip-flop, and
the first flip-flop is configured to output a signal having a same logical value as a logical value of the scan signal in response to a signal output from the first multiplexer.

17. The electronic circuit of claim 11, wherein:
the first flip-flop is configured to receive a scan signal and to output a signal corresponding to the scan signal to the third flip-flop,
the third flip-flop is configured to output a signal corresponding to the scan signal to the fourth flip-flop in response to a signal output from the first flip-flop,
the fourth flip-flop is configured to output a signal corresponding to the scan signal to the second flip-flop in response to a signal output from the third flip-flop, and
the second flip-flop is configured to output a signal corresponding to the scan signal in response to a signal output from the fourth flip-flop.

* * * * *